United States Patent [19]

Soclof

[11] Patent Number: 5,027,184

[45] Date of Patent: Jun. 25, 1991

[54] NPN TYPE LATERAL TRANSISTOR WITH MINIMAL SUBSTRATE OPERATION INTERFERENCE

[75] Inventor: Sidney I. Soclof, San Gabriel, Calif.

[73] Assignee: Rockwell International Corporation, El Segundo, Calif.

[21] Appl. No.: 63,541

[22] Filed: Jun. 17, 1987

Related U.S. Application Data

[63] Continuation-in-part of Ser. No. 239,749, Mar. 2, 1981, abandoned.

[51] Int. Cl.[5] ........................ H01L 29/72; H01L 27/12
[52] U.S. Cl. .......................................... 357/49; 357/35
[58] Field of Search ........................... 357/23.5, 35, 49

[56] References Cited

U.S. PATENT DOCUMENTS 4,519,849  5/1985  Korsh et al. .
4,641,170  2/1987  Ogura et al. .

OTHER PUBLICATIONS

S. A. Evans et al., "A 1-micron Bipolar VLSI Technology", *IEEE Transactions on Electron Devices*, vol. ED-27 (Aug. 1980), pp. 1373-1379.

T. Sakai et al., "Gigabit Logic Bipolar Technology: Advanced Super Self-Aligned Process Technology", *Electronics Letter*, vol. 19, No. 8 (Apr. 14, 1983), pp. 283-284.

S. Konaka et al., "A 30-ps Si Bipolar IC Using Super Self-Aligned Process Technology", *IEEE Transaction of Electron Devices*, vol. ED-33 (Apr. 1986), pp. 526-531.

*Primary Examiner*—J. Carroll
*Attorney, Agent, or Firm*—H. Fredrick Hamann; George A. Montanye; Wilfred G. Caldwell

[57] ABSTRACT

The invention provides a unique sub-micron dimensioned NPN type transistor, wherein hundreds of such transistors may be fabricated on a single chip with each transistor comprising an active region surrounded by field oxide completely isolating it from the substrate and its effects on operation. Slots made in the substrate permit angle evaporation of etch-resist to protect the active region while it is disconnected from the substrate by etching therebeneath via the slots. Substrate oxidation supports the active regions while orthogonal slots are provided permitting access to opposed sides of the active regions for doping P+ which is driven in from one side only while N+ is introduced and driven in from both sides, thereby providing an N+ P+P, N+ emitter, base, collector transistor active region to which electrical connections are applied using conventional techniques, providing almost complete reduction of the parasitic capacitances and resistances because of the total oxide isolation of the active regions from the substrate.

5 Claims, 12 Drawing Sheets

NPN TYPE LATERAL TRANSISTOR WITH MINIMAL SUBSTRATE OPERATION INTERFERENCE

CROSS REFERENCE

This application is a continuation-in-part of Ser. No. 06/239,749 filed Mar. 2, 1981 by the same inventor, abandoned.

FIELD OF THE INVENTION

This invention is a novel structure and method for forming a sub-micron NPN type lateral dielectrically isolated transistor utilizing VLSI chip processing steps to fabricate hundreds of such devices simultaneously.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also the dimensions are now comparable to or even smaller than the base widths used for double diffused transistors, i.e., 0.4-1.0 micrometers. From these techniques, the novel structure and method for the NPN lateral transistor with greatly reduced parasitic capacitance and resistances is achieved.

SUMMARY OF THE INVENTION

The invention is a novel lateral NPN type transistor formed on a substrate by orthogonal slots which define each active region and permit doping of the active regions via opposed slots while supported by oxidation achieved through underlying etching of each active region in a semi-array of regions supported at spaced apart positions and totally isolated from the substrate by substrate oxidation. Electrical connections are conventionally made to the N+ emitter, P+P base and N+ collector.

The following method of making extremely small contacts is an alternative method. It is applied to an NPN lateral bipolar transistor for illustrating versatility, but the principles apply equally to PNP, as outlined infra.

Figure 8:
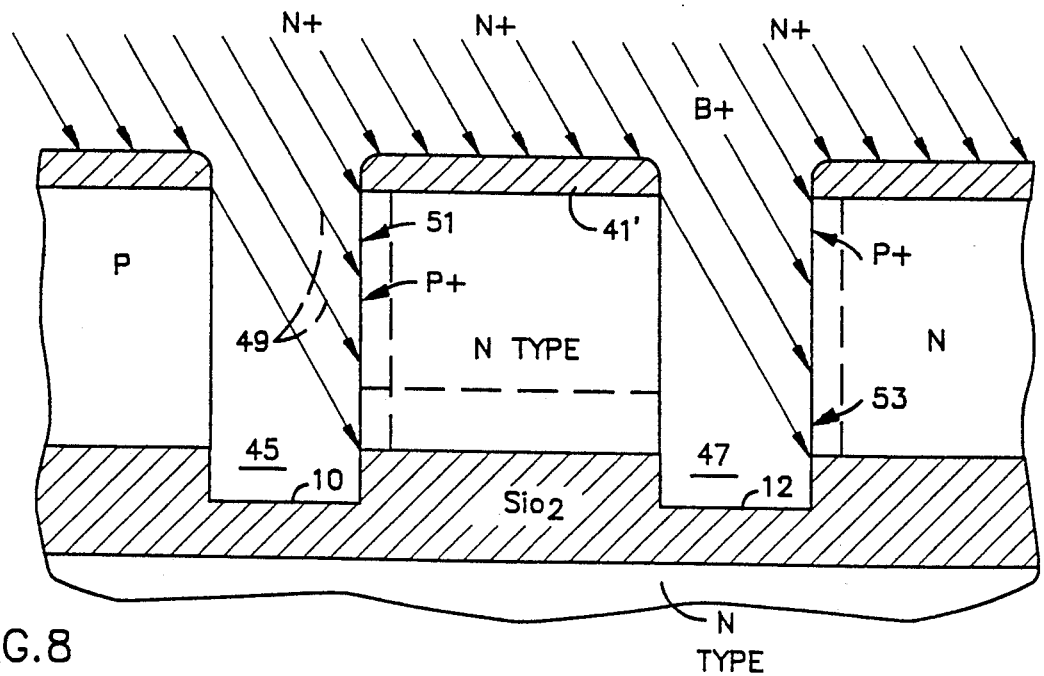
FIG. 8 is a view in section taken across the orthogonal set of slots showing the boron ion implant step to produce the P+ doping shown.
Figure 13:
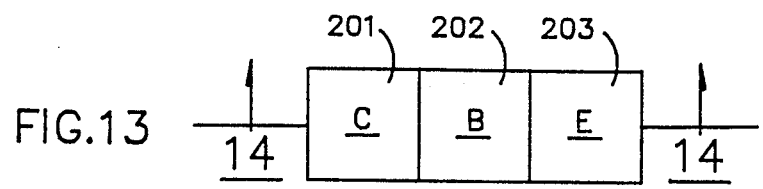
Figure 14:
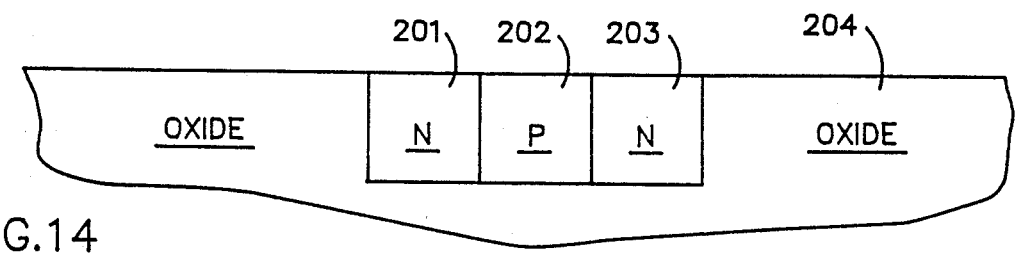
Figure 15:
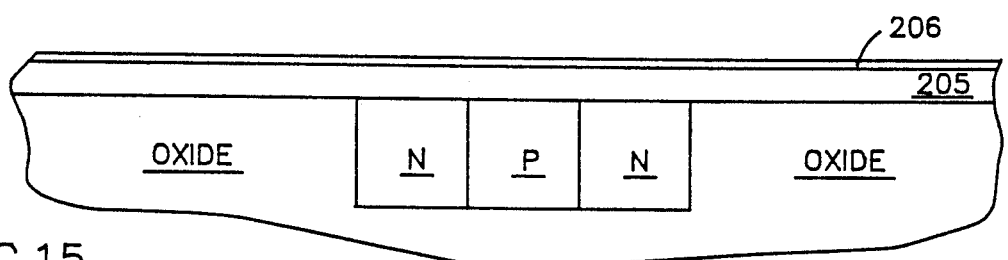
Figure 16:
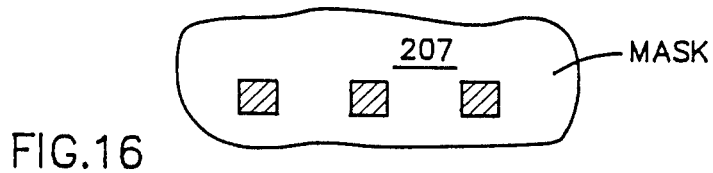
Figure 17:
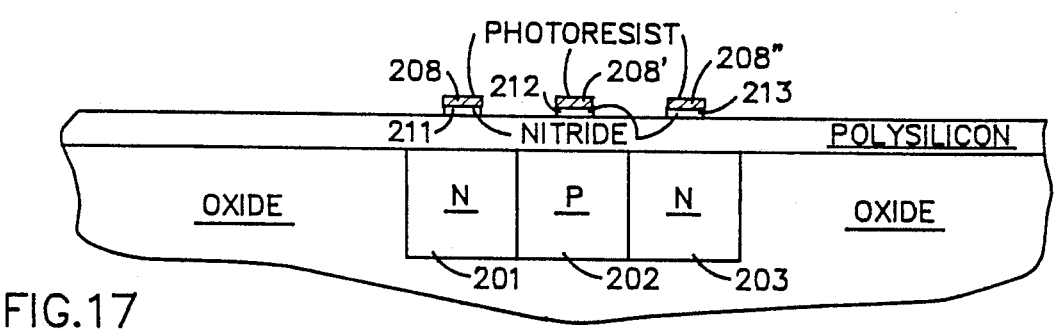
Figure 18:
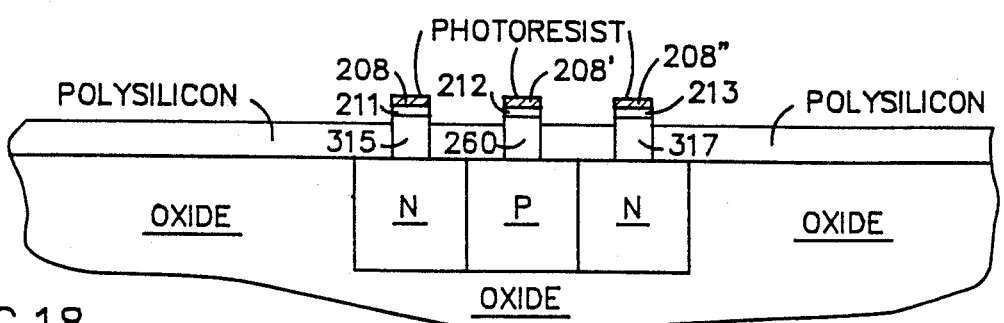
Figure 19:
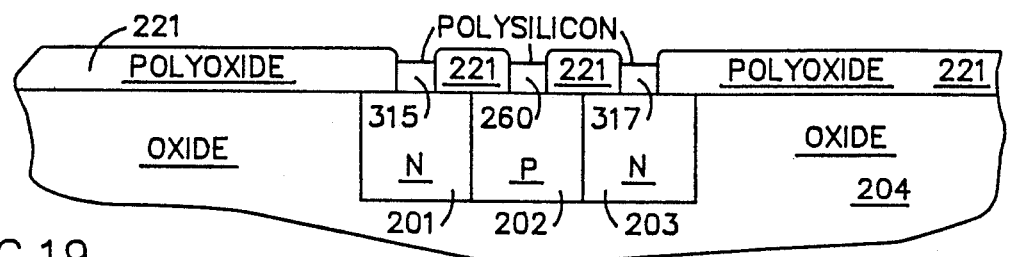
Figure 20:
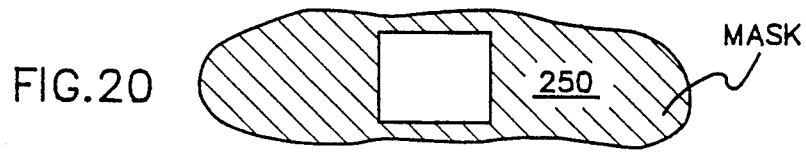
Figure 21:
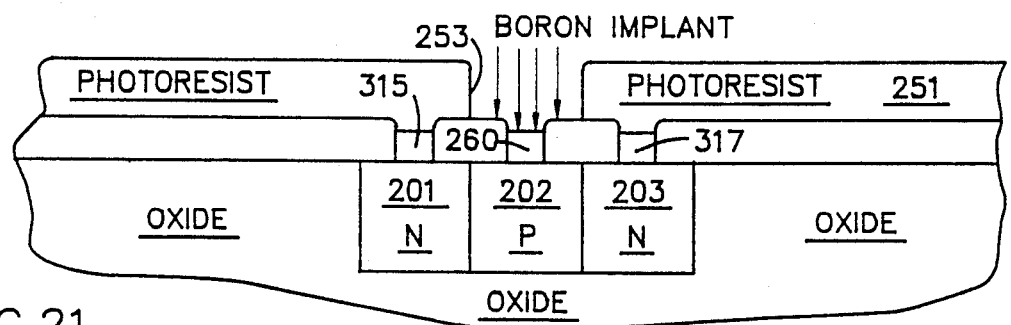
Figure 22:
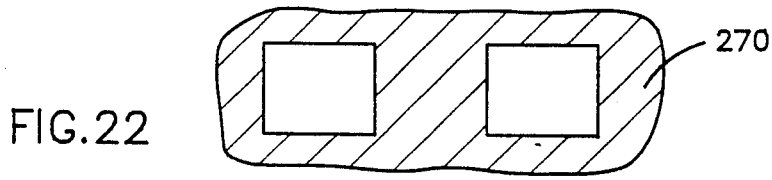
Figure 23:
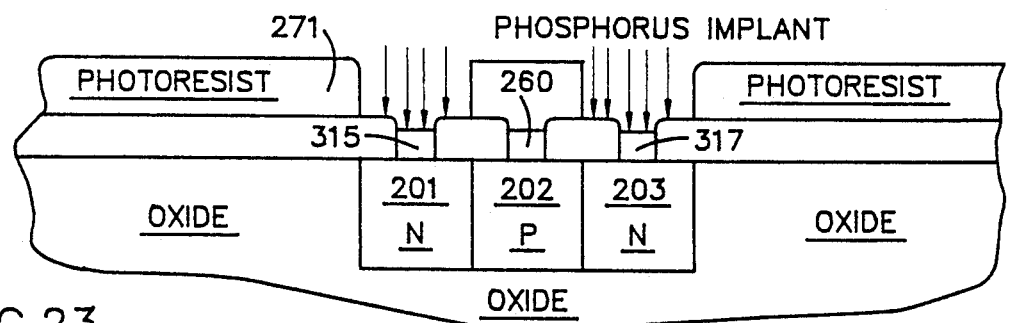
Figure 24:
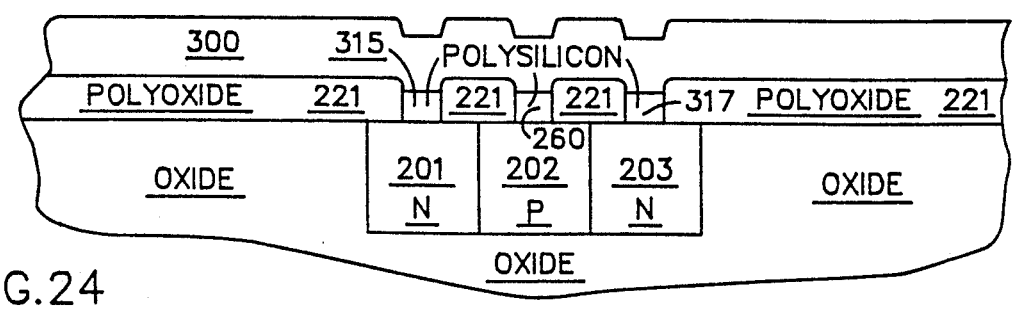
Figure 25:
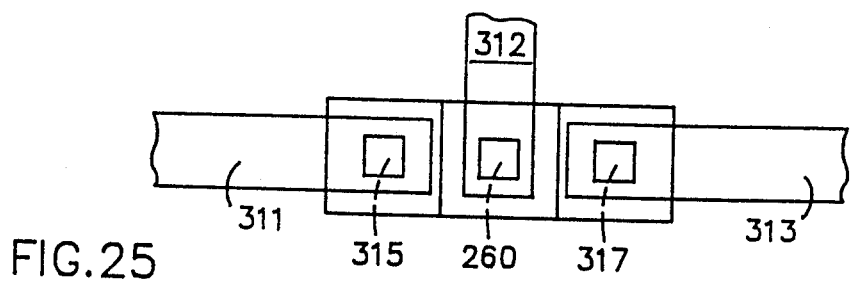
Figure 26:
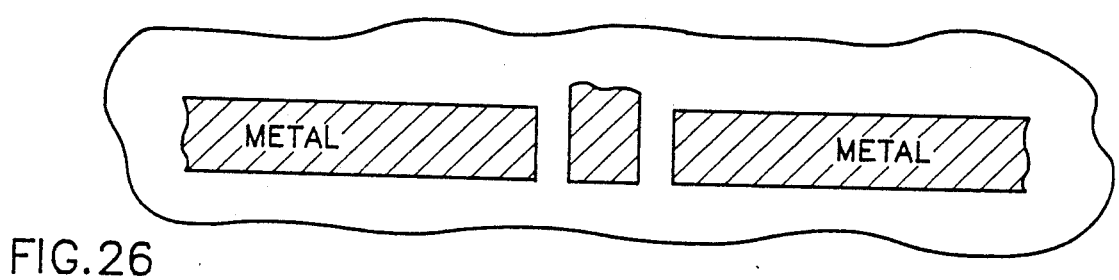
Figure 27:
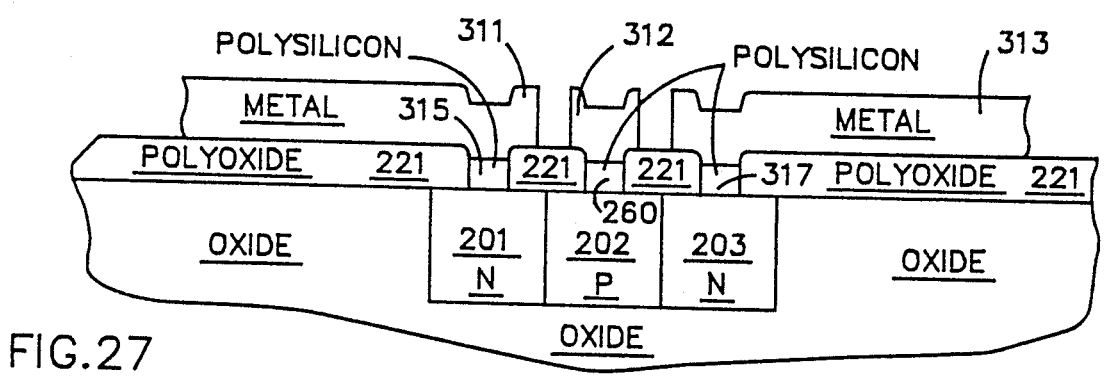
Figure 28:
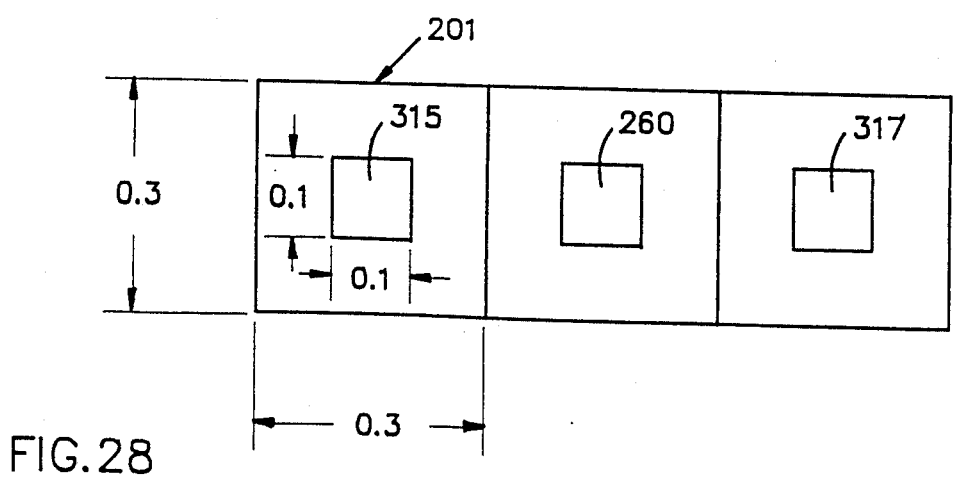

FIG. 13 is a view in top plan of a bipolar device of the type of FIG. 8 without the oxide overlay;

FIG. 14 shows the device of FIG. 13 in cross-section in field oxide;

FIG. 15 shows the application of a polysilicon layer covered by a nitride layer to the structure of FIG. 14;

FIG. 16 shows a contact mask;

FIG. 17 shows the nitride buttons remaining over each of the bipolar elements atop the polysilicon layer;

FIG. 18 shows the etching away of approximately ½ of the polysilicon layer prior to oxidation;

FIG. 19 shows the polysilicon layer converted to polyoxide except where the nitride buttons preserved the polysilicon;

FIG. 20 shows the mask for opening regions to the base electrode polysilicon;

FIG. 21 shows the boron implant to achieve the doping of the polysilicon electrode;

FIG. 22 shows a mask for opening regions to the collector and emitter (N regions);

FIG. 23 shows these regions opened and the polysilicon therein being doped by phosphorus implant;

FIG. 24 shows the nitride buttons removed and the layer of metal over top of the structure;

FIG. 25 shows the arrangement in top plan view as delineated by the mask of FIG. 26;

FIG. 27 shows the completed device following sintering; and,

FIG. 28 shows dimensions achievable in the contact region for these devices, the elements, such as the collector 201 measuring 0.3 by 0.3 microns and the contact regions, such as 315 measuring 0.1 by 0.1 microns.

Figure 29:
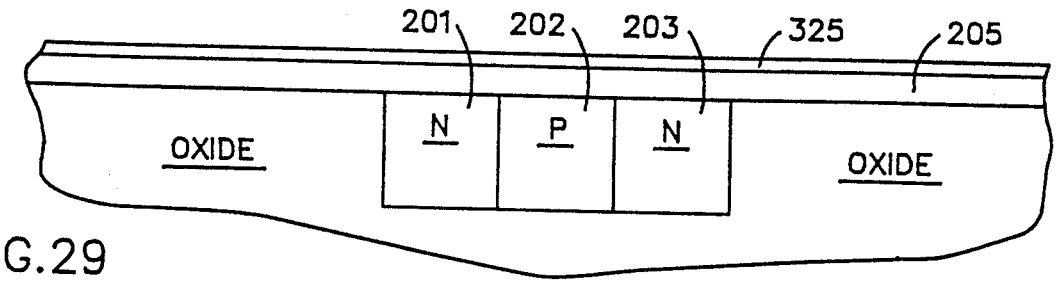
Figure 30:
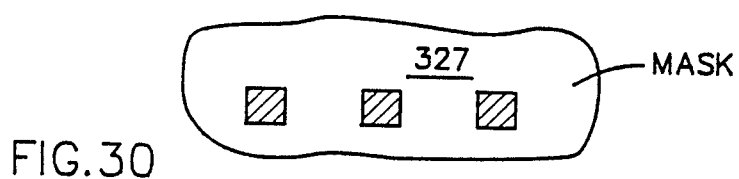
Figure 31:
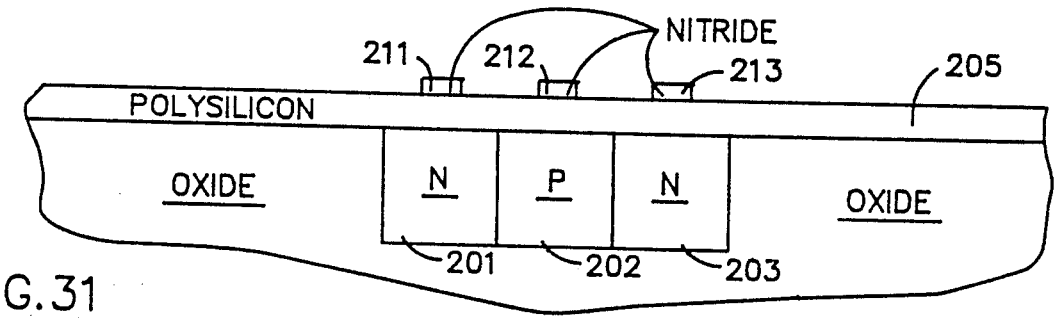
Figure 32:
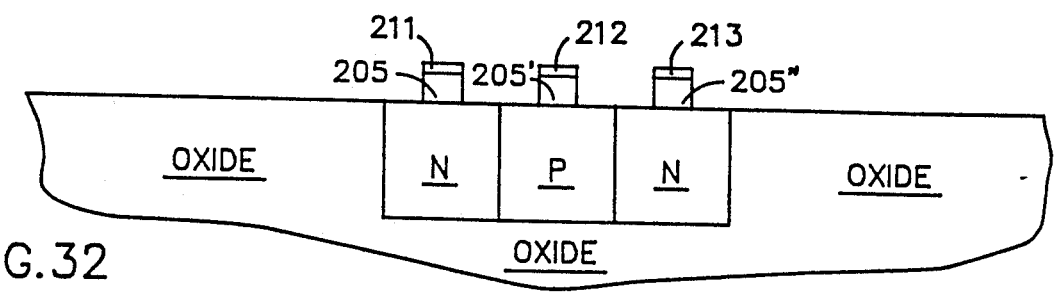
Figure 33:
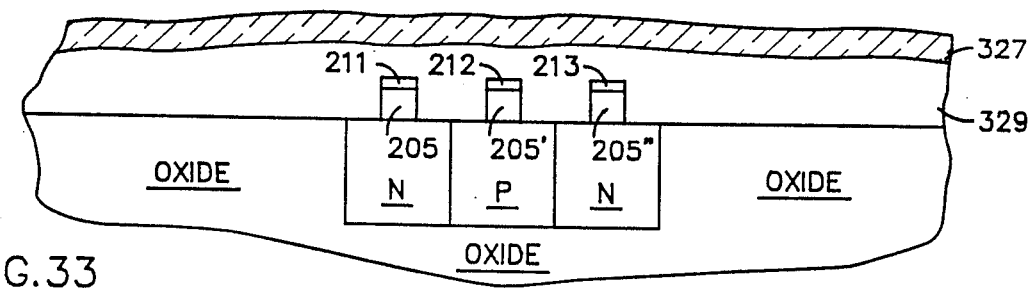
Figure 34:
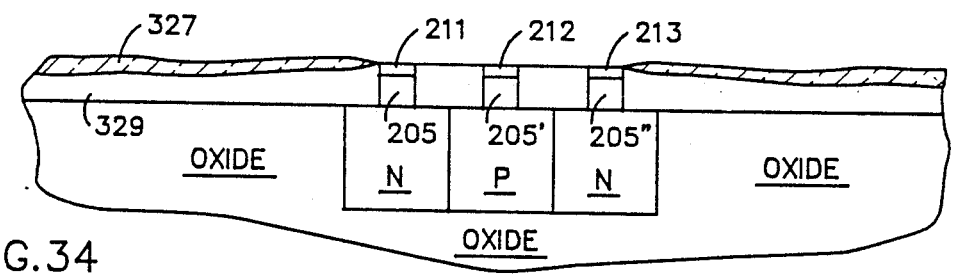
Figure 35:
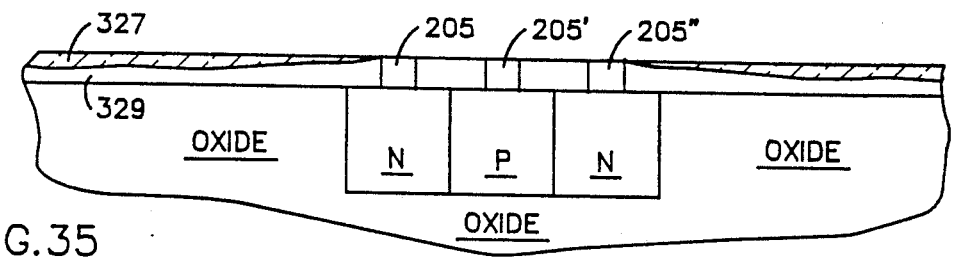
Figure 36:
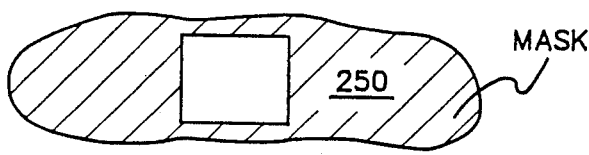
Figure 37:
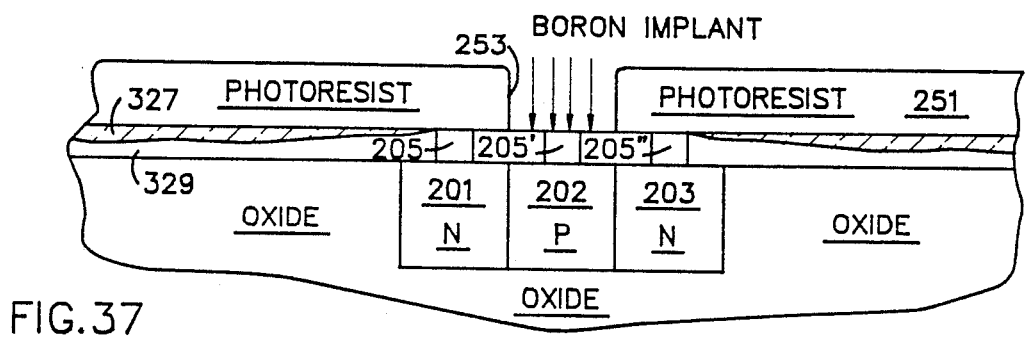
Figure 37A:
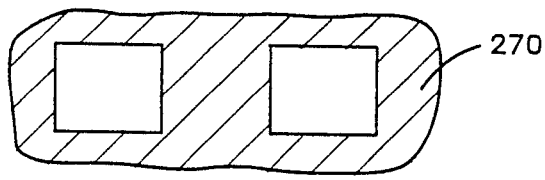
Figure 38:
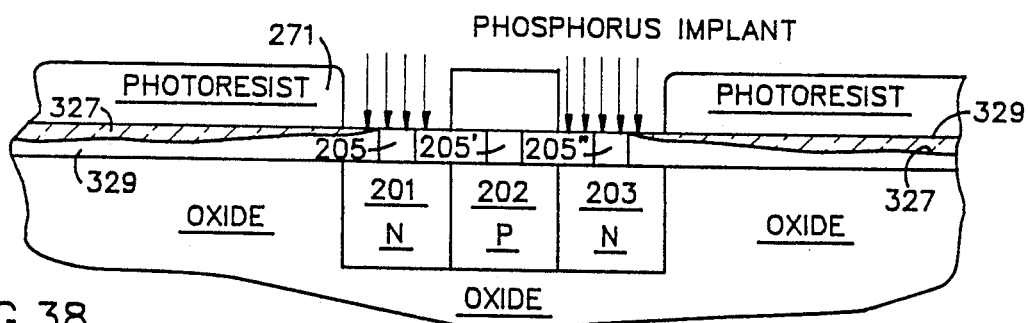
Figure 39:
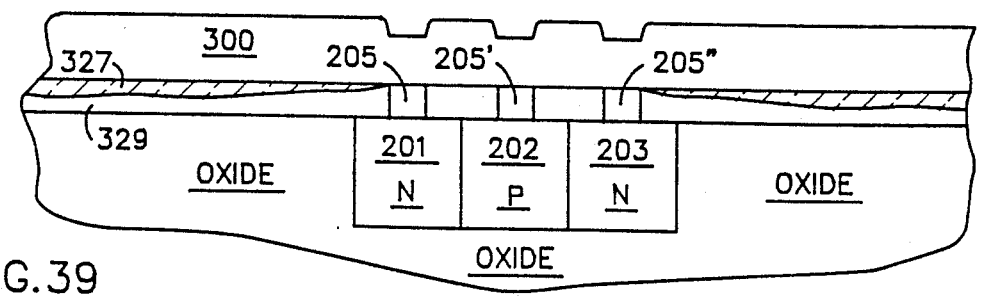
Figure 40:
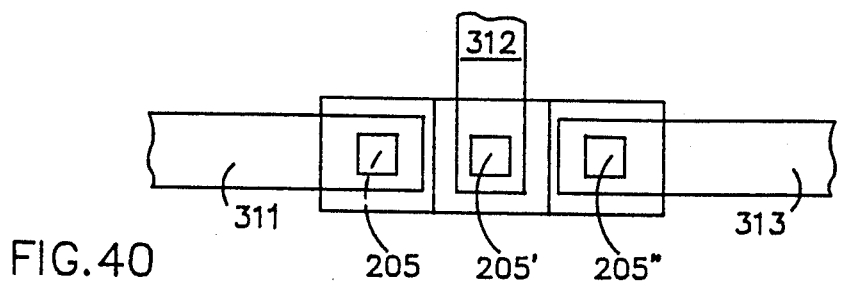
Figure 41:
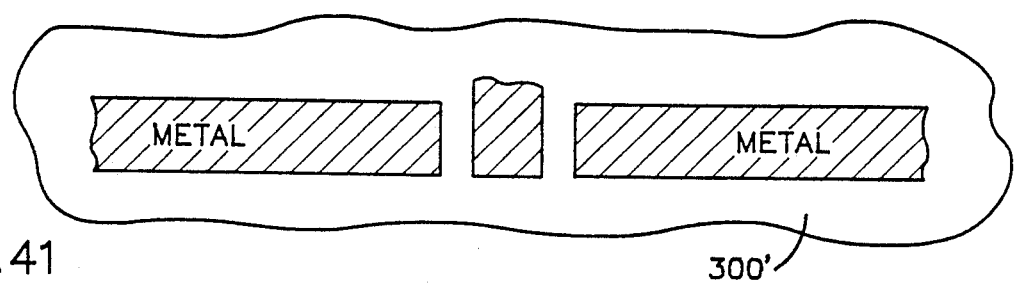
Figure 42:
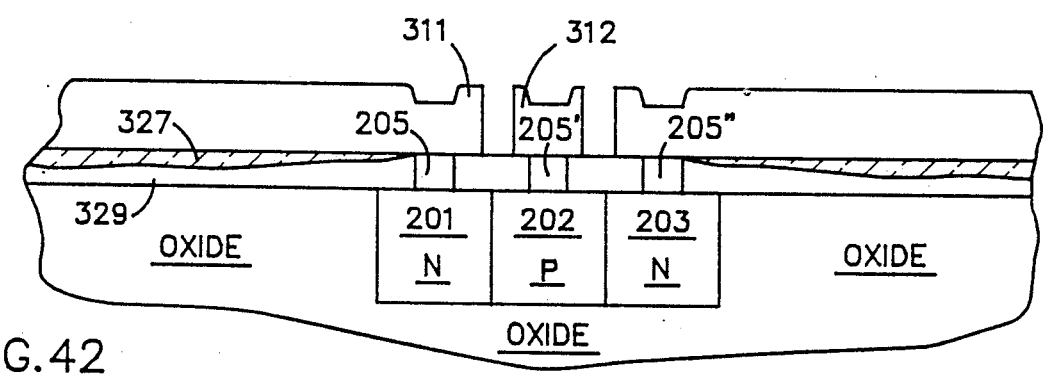
Figure 43:
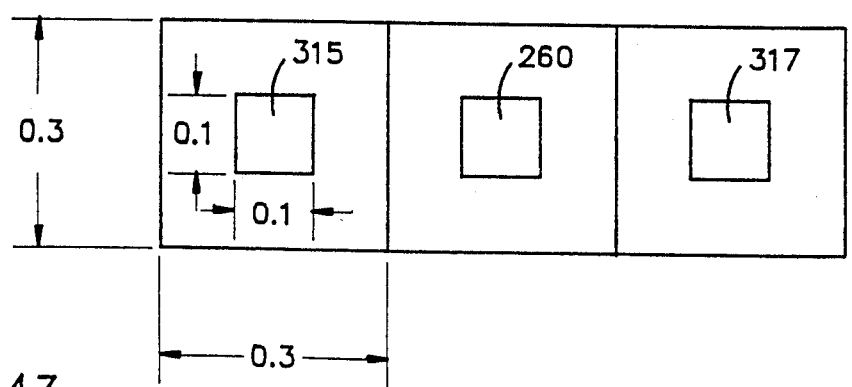

FIGS. 29-43 disclose yet another alternative method for forming the contacts;

FIG. 29 shows the NPN elements of a transistor being formed embedded in oxide and covered by a layer of polysilicon, in turn covered by a layer of nitride;

FIG. 30 is a contact mask;

FIG. 31 shows the nitride contact buttons;

FIG. 32 depicts the isolated polysilicon contacts;

FIG. 33 reveals the plasma oxide covering the contacts, and in turn covered by glass (SOG);

FIG. 34 planarizes the structure of FIG. 33 down to the tops of the nitride buttons;

FIG. 35 shows the structure of FIG. 34 with the nitride buttons removed;

FIG. 36 shows the mask to be used in making a doping opening to the base contact;

FIG. 37 shows the doping step for the base contact;

FIG. 37A shows a mask for making openings to the collector and emitter contacts;

FIG. 38 shows the doping step for the collector and emitter contacts;

FIG. 39 includes the metal interconnect layer;

FIG. 40 shows the delineated metal interconnects;

FIG. 41 shows the mask for effecting the delineation;

FIG. 42 shows the completed device; and,

FIG. 43 is an example of relative sizes available from this method.

DETAILED DESCRIPTION OF A PREFERRED EMBODIMENT

In the device produced in accordance with the present invention, the effects of the substrate are minimized relative to the operation of the device. It should be realized that the active region may be completely contained with the surface of area of $3d \times 5d$ or $15d^2$ wherein d is only 0.4 micrometers. The isolated region is completely separated from the substrate by oxidation and the parasitic capacitances and resistances are almost completely reduced to a minimum value attainable because the transistor is reduced essentially to just its electronically active region whereas in the conventional (vertical) transistor, the electrically active region is only a very small fraction of the total transistor area. The dielectric isolation between transistors offered by the same substrate oxidation has advantages with respect to high frequency performance, high voltage integrated circuits, radiation resistance, circuit flexibility, i.e., the process can provide NPN, PNP, JFET, MOSFET's etc. on the same integrated circuit chip.

Figure 1:
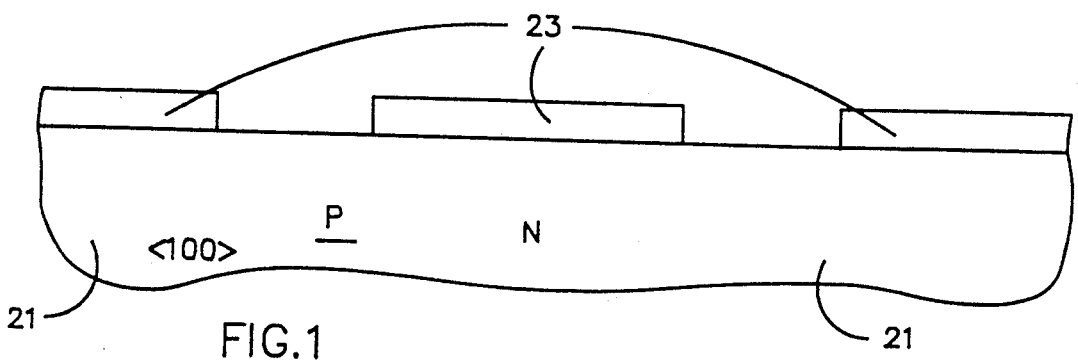
FIG. 1 is a view in section through a P type substrate with photoresist applied through a slotted mask.
Figure 2:
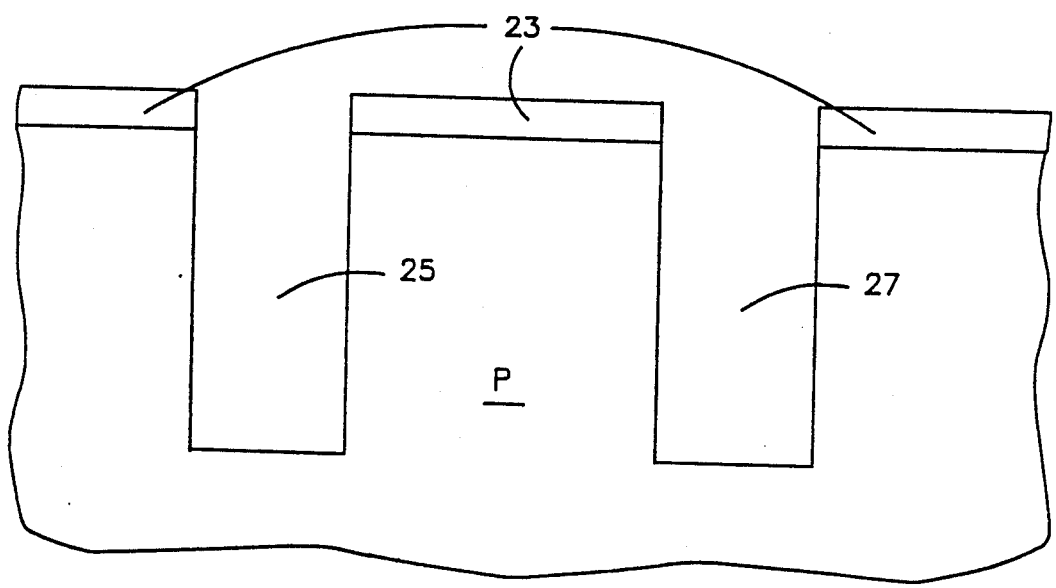
FIG. 2 shows the structure of FIG. 1 with slots formed in the substrate where not protected by the resist.

In FIG. 1, there is shown a silicon substrate of the P type, of standard doping, e.g., $10^{15}$ to $10^{16}$ per cubic cm., having patterned photoresist applied to an upper surface thereof. The pattern may simply comprise longitudinal slots for rendering the photoresist 23 alternately soluble and it may be seen that the soluble photoresist has been removed to provide exposure of the substrate 21 so that the slots 25 and 27 (FIG. 2) may be milled therein or formed by O.D.E. etching process, the latter if the upper surface 21' of substrate 21 is <100> oriented. These slots 25 and 27 penetrate the upper surface 21' of the silicon substrate 21 sufficiently deeply that they extend beneath the depth of the region which will ultimately become the active regions for the various transistors.

Figure 3:
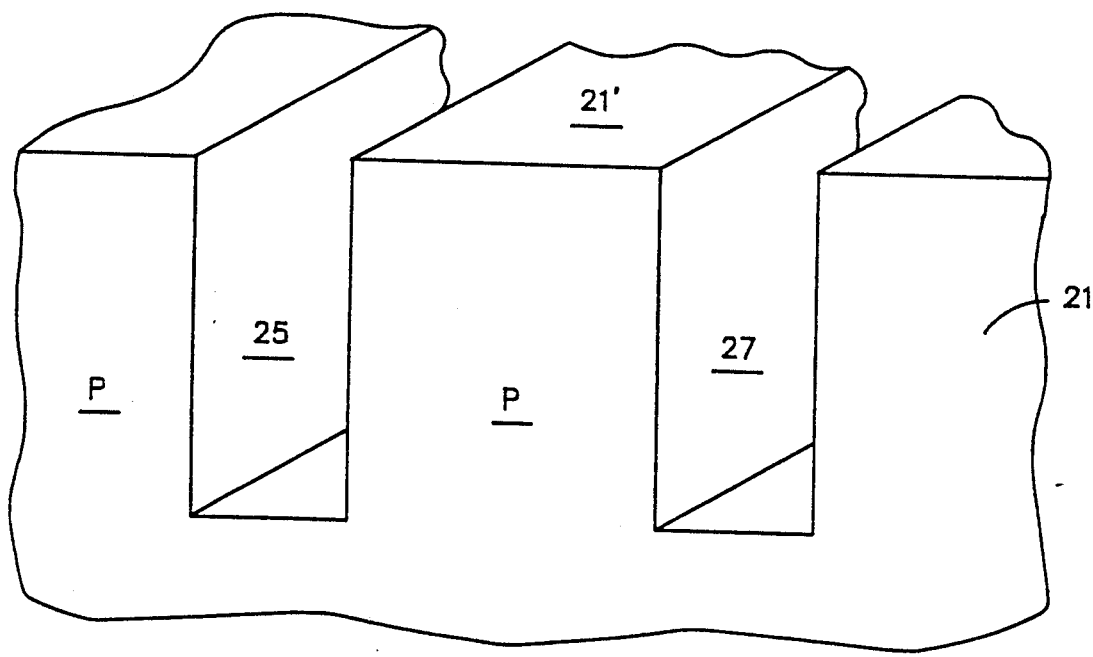
FIG. 3 is a perspective view of the substrate showing the first set of longitudinal slots.

In FIG. 3, the photoresist layer 23 has been removed and the structure is shown in perspective thereby showing the slots 25 and 27 extending inwardly of the upper surface 21' of silicon substrate 21.

Figure 4:
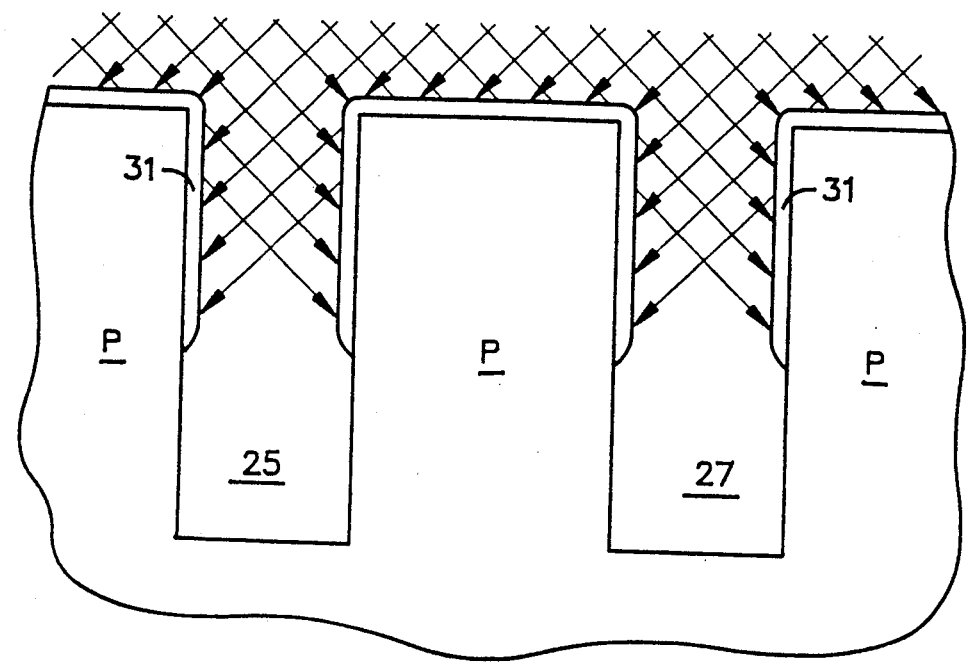
FIG. 4 is a view in section showing the application of an angle evaporation etch resist layer partially protecting the edges of the slots.
Figure 5:
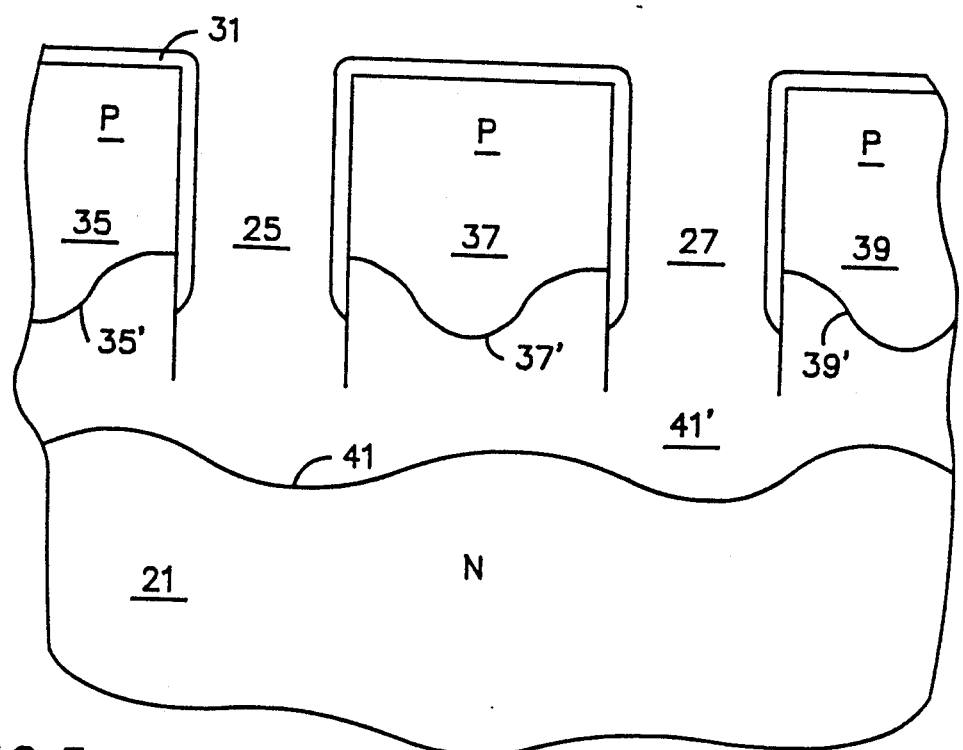
FIG. 5 is a view in section with the etch resist layer in place and showing the effects of the etch having been applied via the slots to undercut the longitudinal regions which will become active regions of the transistors being formed.

In FIG. 4, it may be appreciated why the slots 25 and 27 are necessary. They permit angle evaporation of etch-resist 31 to the edges of the slots 25 and 27. The result provides a protective covering over the tops of the active regions being formed. Also, it should be noted that due to the angle of evaporation of the etch resist 31, this protective layer only extends to a certain depth within slots 25 and 27, but this depth must be adequate to protect the active regions being formed. Thus, in FIG. 5, it may be seen that the active regions are generally shown at 35, 37 and 39 above the silicon substrate etch level 41 and also above the etch levels 35', 37' and 39' where the etch introduced through the slots 25 and 27 removed the substrate from beneath the active regions 35, 37 and 39.

Actually, there are a plurality of active regions aligned in the remaining portions 35, 37 and 39 which represent semi-arrays of transistors being formed. Obviously, the semi-arrays are supported at their ends or spaced apart positions so that the active regions do not collapse into the substrate etched space 41'.

Figure 6:
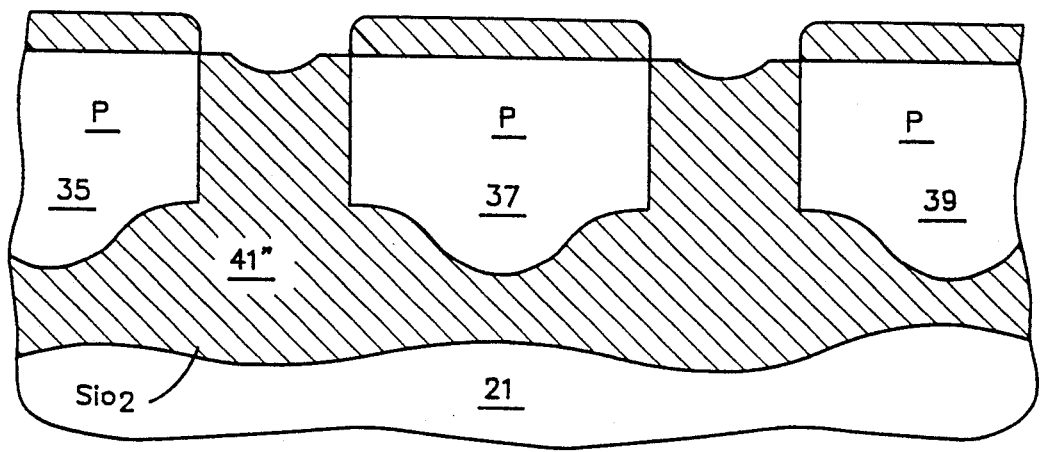
FIG. 6 shows the structure of FIG. 5 after the etch resist has been removed and following oxidation of the substrate to fill in the voids created by the etch.
Figure 7:
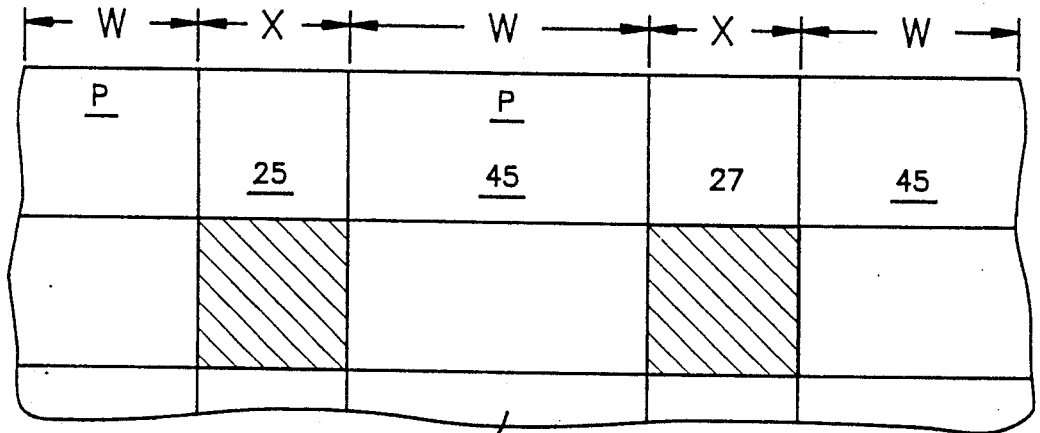
FIG. 7 is a view in plan of the structure of FIG. 6 showing the orthogonal set of slots relative to the original set of slots.

In FIG. 6, it may be seen that the etch resist 31 has been removed and the silicon has been oxidized to $SiO_2$ shown at 41" as filling all the voids between regions 35, 37 and 39 and the silicon substrate 21. Thus, with the regions supported now by the silicon oxide 41", the orthogonally related sets of slots 45 and 47 may be formed as illustrated in the top plan view of FIG. 7. The procedure for forming these slots is the same as before, requiring a photoresist layer patterned in the form of spaced apart slots and the silicon material either ion milled away or etched using O.D.E. techniques, as best shown in FIG. 8.

In FIG. 8, the application of P+ doping is achieved by boron implant shown by the arrows 49 to produce the P+ region 51. A conventional dose of $2 \times 10^{15}$ per $cm^2$ at 30 KV, for example, is used. It should be noted that this implanting is done only into the corresponding right hand edges of slots 45 and 47 to provide the P+ layers 51 and 53.

Figure 9:
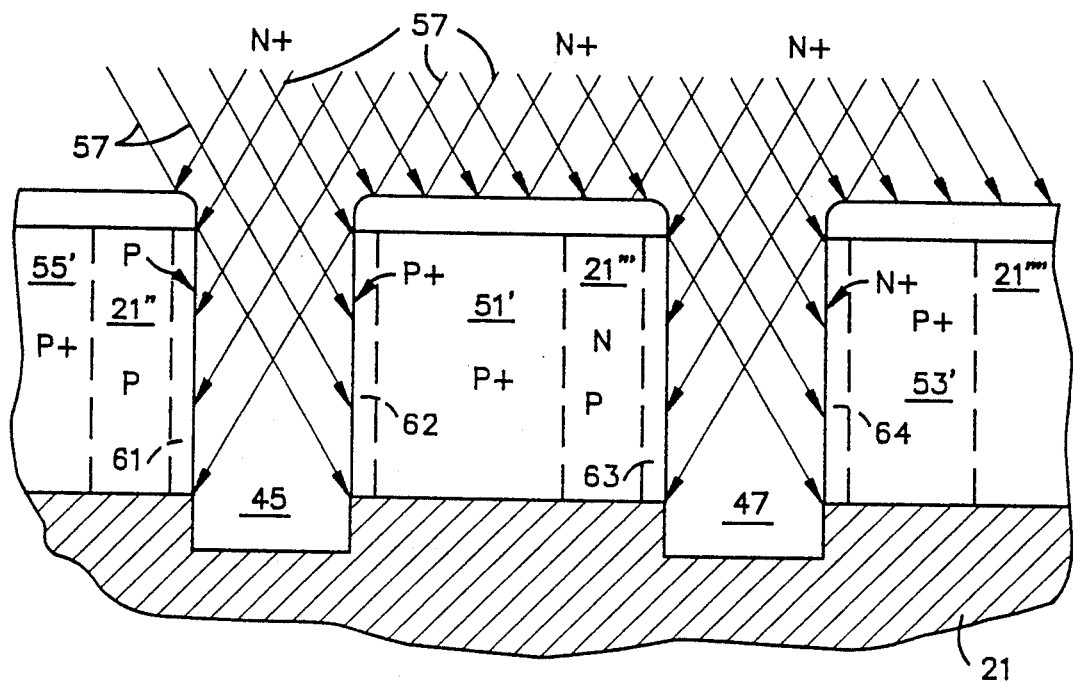
FIG. 9 shows the structure of FIG. 8 taken after boron drive-in and the application of phosphorus deposit or implant.

In FIG. 9, it may be seen that the P+ regions have been driven in, such as by using high heat so that they are expanded as shown by 51' and 53'. Also, a further P+ region is visible to the left at 55', having been produced by a slot to the left of the margin of the page.

Next, in FIG. 9, it will be seen that phosphorus is implanted (or deposited) into both edges of each slot, as shown by the arrows 57, to provide the N+ regions 61, 62, 63 and 64. Conventional ion implanting is used here at e.g. 100 KV and $5 \times 10^{15}$ per $cm^2$. It may also be pointed out that the P regions 21", 21'" and 21"" are the remaining regions from the original P type silicon substrate.

Figure 10:
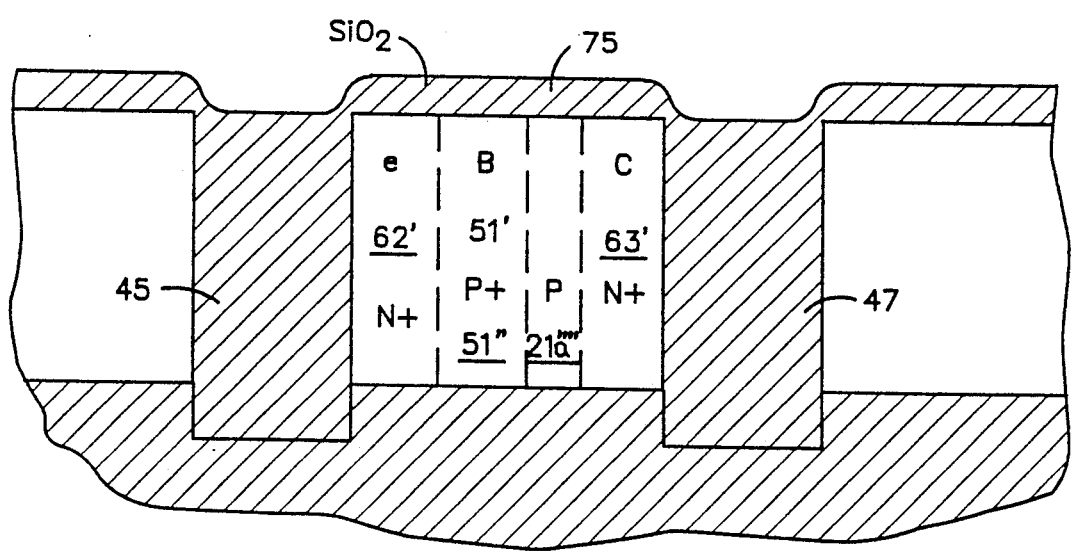
FIG. 10 shows the structure of FIG. 9 following phosphorus drive-in from both sides to produce the N+ regions and following oxidation of the substrate to fill the slots and protect the top.

Proceeding from FIG. 9 to FIG. 10, it may be seen that the phosphorus N+ regions 62 and 63 have now been driven in to comprise the expanded regions 62' and 63'. Accordingly, the P+ region has been changed in size and is now designated 51" as is also true of the remaining P region now identified as 21a"". The region 62' will comprise the emitter with the regions 51" and 21a"" comprising a graded base region, and finally, region 63' being the collector region.

Also, in FIG. 10, it may be seen that the substrate has again been oxidized to fill in the slots 45 and 47 and provide a covering over the active region of the electrodes, generally shown at 75. The doping gradient in the base region is similar to conventional double diffused transistors.

Figure 11:
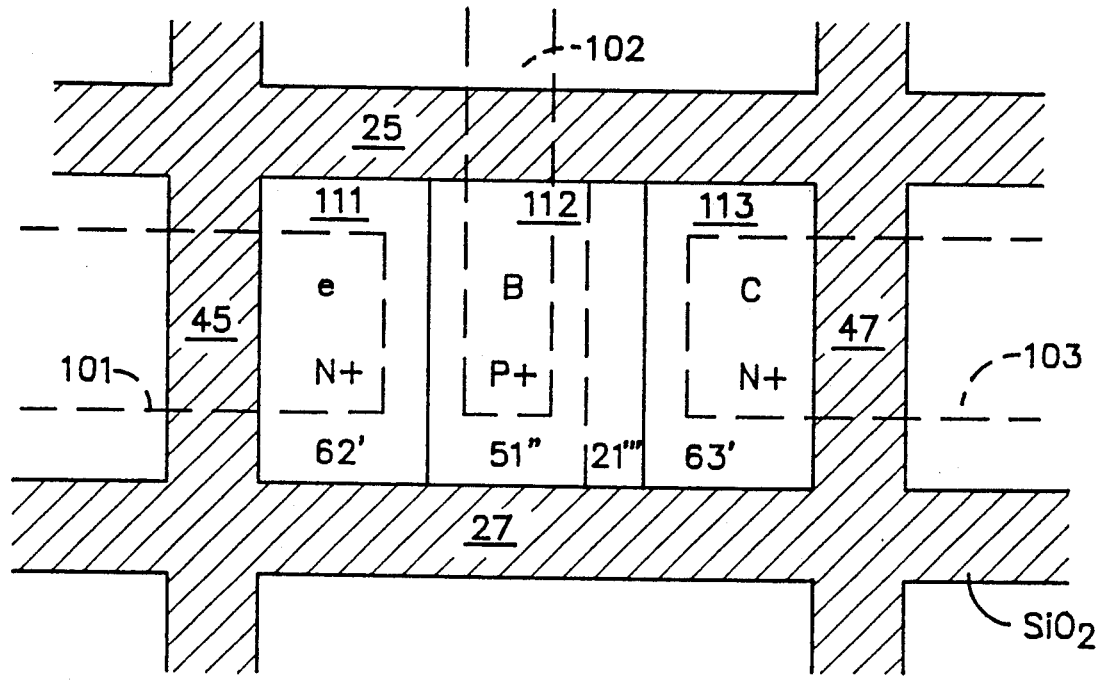
FIG. 11 is a top plan view of the completed structure showing in dashed outline the electrode connections for the emitter, base and collector for a single active region of a single transistor.

A finished transistor is shown in FIG. 11, wherein the contacts 101, 102 and 103 are provided from a metallization layer for the emitter 111, base 112 and collector 113, respectively. These contacts are fabricated simply by conventional techniques for patterning or metallization.

It may be seen that the transistor comprising these three electrodes is surrounded by moats of silicon oxide formed in the slot 25,27 and 45,47. Thus, the transistor is isolated from adjacent transistors or other elements.

Figure 12:
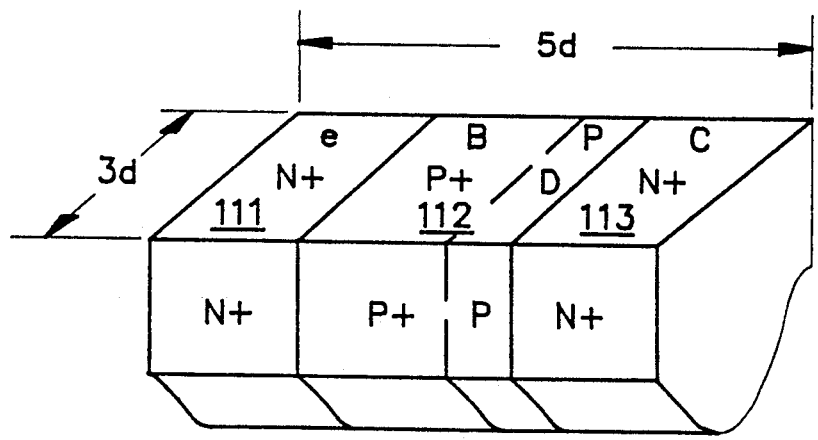
FIG. 12 is a view in perspective of the transistor active region, per se.

The active region of the transistor is visible in FIG. 12 in the perspective view showing the emitter 111, base 112, and collector 113.

The principles of the present invention are compatible with use of the Perkin Elmer Projection Printer equipment for 2 micron dimensions, the 10:1 stepper for 1 micron rated dimensions, and electron beam or X-ray lithography for under 1 micron dimensions.

An alternative method for forming contacts, particularly to very small dimensions, is set forth in FIGS. 13-28.

In FIG. 13, the collector, base and emitter 201, 202 and 203 are depicted in a lateral arrangement, as seen in top plan. Doping of these elements has been accomplished as described through FIG. 10.

In FIG. 14, the collector 201 is shown as being N doped, the base 202 is P doped and the emitter 203 is N doped, all surrounded by oxide.

The first step in building sub-micron contacts (i.e., 0.1 to 0.25 micron by 0.1 to 0.25 micron) for these devices is to deposit undoped polysilicon to approximately 5000 angstroms or less for such diminutive contacts. This step may be applied to the structure of FIG. 10, once upper layer is removed. The contact doping steps of FIGS. 21 and 23 would, of course, be switched for a PNP device.

Returning to FIG. 15, a layer 206 of nitride is deposited to a thickness of approximately 1000 angstroms over polysilicon layer 205.

The mask 207 of FIG. 16 is employed with photoresist 208 to delineate the nitride 206, thereby leaving the nitride buttons 211, 212 and 213 over the collector 201, base 202 and emitter 203 respectively (FIG. 17).

To insure ultimate planarization, a portion of the polysilicon is etch removed (FIG. 18). This may comprise 2500 angstroms of polysilicon. A non-selective or anisotropic etch is employed so that only the polysilicon is removed.

Next, the resist 208, 208' and 208" is stripped and the polysilicon is then oxidized to become polyoxide 221, shown in FIG. 19. The nitride buttons 211, 212 and 213 are removed using a selective or wet etch conventional step. The polyoxide 221 also fills in the spaces between the contacts 315, 260 and 317 and rises slightly above the contacts to insulate them.

FIG. 19 shows the structure after the nitride buttons 211, 212 and 213 have been removed.

In FIG. 20, mask 250 is used, together with photoresist 251, to open aperture 253 to the P doped base 202, (FIG. 20) for boron implanting into the base electrode 260 to insure contact to base 202. Implanting is carried out using a 60 Kev implanter with a 1 to $5 \times 10^{15}$ ions per cm$^2$ dose.

Next, the photoresist 251 is stripped and a new layer 271 applied for use with the mask 270 (FIG. 22) to open the new layer of photoresist 271 above the collector 201, and emitter 203. The phosphorus ions are implanted, the photoresist 271 is stripped and the device of FIG. 23 is annealed for the implants at 800° C. for 40 minutes in a nitrogen atmosphere.

In FIG. 24, a metal layer 300 has been applied over the structure polyoxide 221 and other structure and the metal mask of FIG. 26 is applied, and the metal is etched to provide a metal interconnect 311 (FIG. 25) to the doped poly electrode 315 of collector 201, interconnect 312 to the doped poly electrode 260 of base 202 and interconnect 313 to the doped poly electrode 317 of emitter 203.

FIG. 27 shows a completed device.

FIG. 28 shows relative sizes for the bipolar device, the elements themselves, such as the collector, measuring 0.3 by 0.3 microns and the contact regions, measuring 0.1 by 0.1 microns.

Yet another alternative method for forming the contacts is disclosed, beginning with FIG. 29 wherein the three elements collector 201, base 202 and emitter 203 are first covered by polysilicon 205 to a depth of, e.g., approximately 3000 angstroms, and nitride 325 is deposited to a depth of, e.g., approximately 1000 angstroms. Mask 327 serves to form the nitride buttons 211, 212 and 213 (the same as before). These nitride buttons 211-213 are preferably centered over the collector 201, base 202 and emitter 203 as seen in FIG. 31, although considerable leeway is available for any misalignment, as is apparent from FIG. 43.

In FIG. 32, the unprotected polysilicon 205 is removed in conventional manner, such as by etching to leave undoped polysilicon contacts 205, 205', and 205".

In FIG. 33, plasma oxide 329 is deposited using the conventional planarization process to a depth of approximately 3000 angstroms. This step is followed by spinning on glass 327 (SOG) so as to look substantially planar.

In FIG. 34, a reactive ion etching (RIE) conventional step is carried out for effecting planarization which exposes the nitride buttons 211, 212 and 213 and is terminated approximately at the level of the tops of these buttons.

In FIG. 35, the nitride buttons 211, 212 and 213 have been removed from the contacts 205, 205' and 205" using a conventional step to prepare the contacts for doping to make them properly conductive.

In FIG. 36, mask 250 is shown for delineating photoresist 251, in the previous manner, to provide the opening 253 for the boron implant, as shown by the arrows in FIG. 37.

In similar fashion, mask 270 of FIG. 37A, is again utilized to delineate the photoresist 271 for the phosphorus implants, shown by the arrows (FIG. 38), thereby concluding the doping of the three polysilicon contacts 205, 205' and 205" in the same N or P doping as their underlying collector, base and emitter.

In FIG. 39, the metal layer 300 has been applied over this structure, and the metal mask of FIG. 41, shown at 300', is used and the metal is etched to provide the metal interconnects 311 (FIG. 40) to the doped poly electrode 205 of collector 201, interconnect 312 to the doped poly electrode 205' of the base 202 and interconnect 313 to the doped poly electrode 205" of emitter 203.

FIG. 42 shows the completed device made in this fashion.

Finally, FIG. 43 shows, by way of example, relative sizes for the bipolar device, the elements themselves such as the collector measuring 0.3 by 0.3 microns and the contact regions measuring 0.1 by 0.1 microns.

The use of an E-beam fabricator, guided by the masks successively used herein, makes the VLSI contacts of the order of these submicron dimensions. Of course, larger contacts might be readily utilized.

If desired, single MOS or bipolar devices may be made, and it is only necessary to insulate them by isolation, usually in lieu of the field oxide, illustrated.

This method is also applicable to MOS, GaAs and conventional bipolar minimal size contacts obtained down to 0.1×0.1 microns, or to 0.1 micron diameter where the spot size is 0.1 micron, or up to 1 micron sizes or larger.

In summary, the following advantages are achieved by this invention:

1. Sub-micron contact technology.

2. Contact integrity without the need of excessive silicon content in the metal or contact barriers such as Titanium Nitride, etc.

3. Planar structures without severe steps to hinder metal step coverage, or restrictions for proximity of contact to vias to gates, thereby improving packing density.

4. Principle applicable to MOS (NMOS, PMOS, CMOS, etc.), Bipolar devices anu GaAs technologies.

5. Contact technology compatible with shallow junctions and other state of the art processes such as selective silicides.

6. Minimum overlap of metal for interconnects.

7. Via overlap of contact realizable with this technique.

What is claimed is:

1. An array of sub-micron dimensioned NPN type lateral transistors formed in a substrate doped P-type, each comprising in combination:
   spaced apart slots in the substrate through selected ones of which P+ type doping is received into the adjacent substrate and driven in followed by N+ doping driving in through opposed slots;
   said spaced apart slots comprising spaced apart pairs of slots orthogonally related to further pairs of slots with each pair of slots and each further pair of slots bounding a portion of the substrate comprising a region;
   said slots filled with field oxide and surrounding each said region where a transistor will be formed;
   said N+ doping on the inner sides of spaced apart slots within said regions comprising emitter and collector electrode areas;
   said P+ doping and the P substrate in said region between the N+ doping comprising a graded base electrode;
   an electrical contact on each N+ electrode area and on the P+ doping and the P substrate graded electrode area; and,
   said contacts measuring approximately 0.1 micron across.

2. The transistor of claim 1, wherein:
   said region is substantially rectangular having a length of 5d and a width of 3d, wherein d is 0.4 to 1 micrometer.

3. The transistor of claim 1 wherein said region is isolated by substrate oxidation from the substrate.

4. A sub-micron dimensioned NPN type lateral transistor formed in a P-type substrate, comprising in combination:
   a transistor region isolated from the substrate by substrate oxide filling orthogonally related slots around the region and completely underlying the region;
   said region comprising an emitter N+ electrode, a graded base P+P electrode, and a collector N+ electrode;
   said region doped from a first side through a first slot prior to filling said slot with oxide by P+ doping driven in followed by N+ doping driven in;
   said region doped from a side opposite said first side by N+ doping driven in; and,
   an electrical contact on each of the electrodes measuring approximately 0.1 micron across.

5. The transistor of claim 4, wherein;
   the P+ doping is supplied by positive boron ions angle implanted relative to said first side and the N+ doping is supplied by phosphorus ions angle implanted through said first side and said opposite side; and,
   said transistor having a substrate area measuring approximately 5d by 3d, wherein d is 0.4 to 1 micrometer.

* * * * *